(12) United States Patent
Kim

(10) Patent No.: US 10,008,289 B2
(45) Date of Patent: Jun. 26, 2018

(54) SEMICONDUCTOR MEMORY DEVICE AND METHOD OF OPERATING THE SAME

(71) Applicant: SK hynix Inc., Gyeonggi-do (KR)

(72) Inventor: Tae Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 77 days.

(21) Appl. No.: 15/211,862

(22) Filed: Jul. 15, 2016

(65) Prior Publication Data

US 2016/0329109 A1    Nov. 10, 2016

Related U.S. Application Data

(62) Division of application No. 14/292,299, filed on May 30, 2014, now Pat. No. 9,406,402.

(30) Foreign Application Priority Data

Jun. 21, 2013 (KR) .................. 10-2013-0071659

(51) Int. Cl.
  *G11C 29/50* (2006.01)
  *G11C 16/34* (2006.01)
  *G11C 16/26* (2006.01)
  *G11C 11/56* (2006.01)
  *G11C 16/14* (2006.01)
  (Continued)

(52) U.S. Cl.
  CPC .... *G11C 29/50004* (2013.01); *G11C 11/5642* (2013.01); *G11C 16/14* (2013.01); *G11C 16/26* (2013.01); *G11C 16/3418* (2013.01); *G11C 29/12005* (2013.01); *G11C 29/36* (2013.01); *G11C 29/38* (2013.01); *G11C 29/44* (2013.01); *G11C 2029/5004* (2013.01)

(58) Field of Classification Search
  CPC .......... G11C 29/50004; G11C 16/3418; G11C 16/26; G11C 11/5642; G11C 2029/5004
  See application file for complete search history.

(56) References Cited

U.S. PATENT DOCUMENTS 5,961,653 A * 10/1999 Kalter ................. G06F 11/2635
    714/30
6,288,936 B1 * 9/2001 Kawamura ......... G11C 11/5621
    365/185.03

(Continued)

OTHER PUBLICATIONS

Office Action issued by the United States Patent and Trademark Office for a continuation U.S. Appl. No. 15/211,779, filed Jan. 3, 2017.

*Primary Examiner* — Joseph D Torres
(74) *Attorney, Agent, or Firm* — IP & T Group LLP

(57) ABSTRACT

A semiconductor memory device and a method of operating the same are provided. The method of operating the semiconductor memory device includes detecting a first group of changed bits between first and second page data, by comparing the first and second page data, which are read out using first and second test voltages from the memory cells, respectively, detecting a second group of changed bits between the second page data and a third page data, by comparing the second page data with the third page data read out from the memory cells using a third test voltage, comparing the numbers of the first and second groups of changed bits, and determining one of the first to third test voltages as a read voltage according to the comparing of the numbers of the first and second groups of changed bits.

5 Claims, 12 Drawing Sheets

(51) Int. Cl.
*G11C 29/12* (2006.01)
*G11C 29/36* (2006.01)
*G11C 29/38* (2006.01)
*G11C 29/44* (2006.01)

(56) References Cited

U.S. PATENT DOCUMENTS

| | | | | |
|---|---|---|---|---|
| 6,381,670 | B1* | 4/2002 | Lee | G11C 8/10 365/104 |
| 6,453,433 | B1* | 9/2002 | Vollrath | G11C 29/02 714/718 |
| 6,545,912 | B1* | 4/2003 | Pawletko | G11C 16/344 365/185.18 |
| 7,656,710 | B1* | 2/2010 | Wong | G11C 11/5628 365/185.18 |
| 9,812,223 | B2* | 11/2017 | Kim | G11C 29/50004 |
| 2005/0018490 | A1* | 1/2005 | Leconte | G11C 16/3418 365/185.29 |
| 2005/0083735 | A1* | 4/2005 | Chen | G11C 11/5628 365/185.17 |
| 2006/0209592 | A1* | 9/2006 | Li | G11C 11/5642 365/185.03 |
| 2008/0094891 | A1* | 4/2008 | Ho | G11C 11/5642 365/185.03 |
| 2008/0144370 | A1* | 6/2008 | Park | G11C 11/5628 365/185.03 |
| 2010/0220511 | A1* | 9/2010 | Kurjanowicz | G11C 17/16 365/96 |
| 2012/0250414 | A1* | 10/2012 | Khandelwal | G11C 16/26 365/185.17 |
| 2013/0015915 | A1* | 1/2013 | Komatsu | G11C 29/12005 327/564 |
| 2013/0223155 | A1* | 8/2013 | Oowada | G11C 11/5642 365/185.22 |
| 2014/0071761 | A1* | 3/2014 | Sharon | G11C 16/26 365/185.18 |
| 2015/0029796 | A1* | 1/2015 | Choi | G11C 11/5642 365/189.05 |
| 2016/0260492 | A1* | 9/2016 | You | G11C 16/26 |
| 2016/0329109 | A1* | 11/2016 | Kim | G11C 29/50004 |

* cited by examiner

SEMICONDUCTOR MEMORY DEVICE AND METHOD OF OPERATING THE SAME

CROSS-REFERENCE TO RELATED APPLICATION

This application is a division of U.S. patent application Ser. No. 14/292,299 file on May 30, 2014, which claims priority to Korean patent application No. 10-2013-0071659 filed on Jun. 21, 2013. The disclosure of each of the foregoing application is incorporated herein by reference in its entirety.

BACKGROUND

1. Field of the Invention

Various embodiments of the present invention relate to an electronic device, and more particularly, to a semiconductor memory device and a method of operating the same.

2. Description of the Related Art

Semiconductor memory devices comprise semiconductor materials such as silicon (Si), germanium (Ge), gallium arsenide (GaAs), indium phosphide (InP), and so on. Semiconductor memory devices are classified into volatile memory devices and nonvolatile memory devices.

Volatile memory devices lose stored data when their power supplies are cut off. Volatile memory devices include static random access memory (SRAM), dynamic RAM (DRAM), synchronous DRAM (SDRAM), etc. Nonvolatile memory devices retain stored data even when their power supplies are cut off. Nonvolatile memory devices include read only memory (ROM), programmable ROM (PROM), erasable programmable ROM (EPROM), electrically erasable programmable ROM (EEPROM), flash memory, phase-change RAM (PRAM), magnetic RAM (MRAM), resistive RAM (RRAM), ferroelectric RAM (FRAM), etc. The flash memories are classified into a NOR type and a NAND type.

SUMMARY

Various embodiments of the present invention are directed to a semiconductor memory device and a method of operating the same in which a read operation speed and a regulating speed of a read voltage may be improved.

One embodiment of the present invention provides a method of operating a semiconductor memory device including detecting a first group of changed bits between first and second page data, by comparing the first and second page data, which are read out using first and second test voltages from the memory cells, respectively; detecting a second group of changed bits between the second page data and a third page data, by comparing the second page data with the third page data read out from the memory cells using a third test voltage; comparing the numbers of the first and second groups of changed bits, and determining one of the first to third test voltages as a read voltage according to the comparing of the numbers of the first and second groups of changed bits.

Another embodiment of the present invention provides a semiconductor memory device including memory cells connected a word line, and a peripheral circuit suitable for determining one of first to $k^{th}$ (k is a natural number equal to or greater than 3) test voltages as a read voltage for a read operation by reading first to $k^{th}$ page data from the memory cells through application of the first to $k^{th}$ test voltages to the word line, and by comparing the number of a first group of data bits changed between the $(k-2)^{th}$ and $(k-1)^{th}$ page data, with the number of a second group of data bits changed between the $(k-1)^{th}$ and $k^{th}$ page data.

Still another embodiment of the present invention provides a memory system including a semiconductor memory device including memory cells connected to a word line, a peripheral circuit suitable for controlling the memory cells, and a controller suitable for controlling the semiconductor memory device. The peripheral circuit may determine one of first to $k^{th}$ (k is a natural number equal to or greater than 3) test voltages as a read voltage for a read operation by reading first to $k^{th}$ page data from the memory cells through application of the first to $k^{th}$ test voltages to the word line, and by comparing the number of data bits changed between the $(k-2)^{th}$ and $(k-1)^{th}$ page data with the number of data bits changed between the $(k-1)^{th}$ and $k^{th}$ page data.

Still another embodiment of the present invention provides a method of operating a semiconductor memory device including detecting a number of a first group of bits, logic values of which are changed when read operations to the memory cells are performed using a first and second read voltages; detecting a number of a second group of bits, logic values of which are changed when the read operations to the memory cells are performed using the second read voltage and a third read voltage; repeating the detecting of the numbers of the first and second groups of bits by increasing levels of the first to third read voltages until the number of the first group of bits is smaller than the number of the second group of bits; and resetting an operational read voltage to the second read voltage when the number of the first group of bits is smaller than the number of the second group of bits.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art.

Throughout this specification, when an element is referred to as being "connected" to another element, the element can be "directly connected" to the other element or "indirectly connected" to the other element with other intervening element(s). Throughout this specification, when a certain part "includes" a certain component, it does not exclude cases in which other components are included unless otherwise defined.

Figure 1:
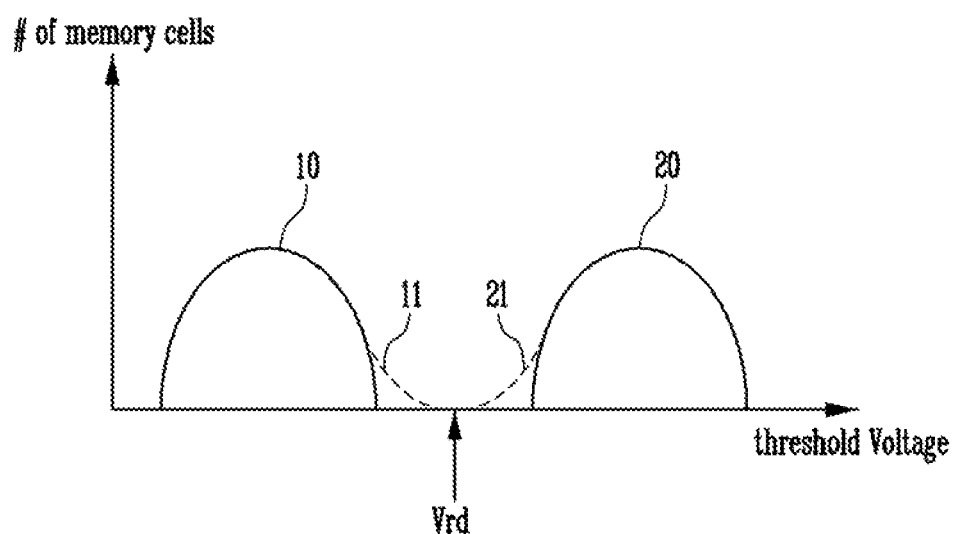
FIG. 1 is a graph illustrating a voltage distribution of memory cells included in a semiconductor memory device.

FIG. 1 is a graph illustrating a voltage distribution of memory cells included in a semiconductor memory device. FIG. 1 shows a threshold voltage on a horizontal-axis, and the number of memory cells on a vertical-axis.

Referring to FIG. 1, memory cells may have a plurality of threshold voltage states 10 and 20. For example, when one bit is stored in each memory cell, the memory cells may have a first threshold voltage state 10 or a second threshold voltage state 20 as shown in FIG. 1. The first threshold voltage state 10 may represent memory cells of a logical state "low," and the second threshold voltage state 20 may represent memory cells of a logical state "high."

As is well known, distribution widths of the threshold voltage states 10 and 20 may be widened due to various causes. As the distribution widths of the threshold voltage states 10 and 20 are widened, the reliability of data of the memory cells is reduced. For example, memory cells having a first threshold voltage state 10 may have a third threshold voltage state 11 by increasing threshold voltages thereof. Memory cells having a second threshold voltage state 20 may have a fourth threshold voltage state 21 by reducing threshold voltages thereof.

As the read margin is reduced, it is necessary to accurately set a read voltage Vrd for an effective read operation.

Conventionally, the read voltage Vrd is controlled by a controller located outside the semiconductor memory device. More specifically, the controller controls the semiconductor memory device to perform a read operation, and determines whether a number of error bits included in the read out data is greater than a predetermined number. If the number of error bits is greater than the predetermined number, the controller regulates the read voltage Vrd according to a specific algorithm. That is, according to the prior art, the time for the data read-out from the semiconductor memory device is required to determine whether to regulate the read voltage Vrd.

Figure 2:
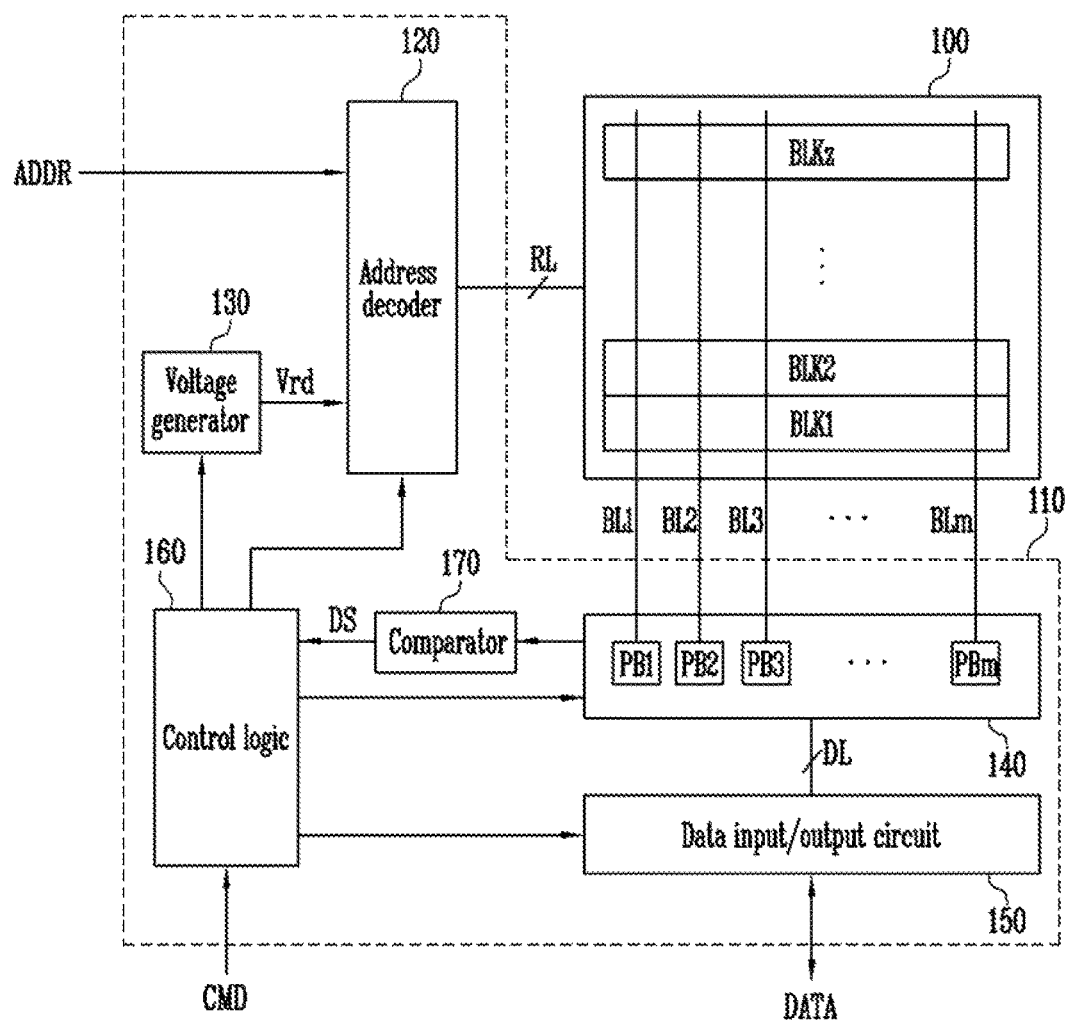
FIG. 2 is a block diagram illustrating a semiconductor memory device according to an embodiment of the present invention.

FIG. 2 is a block diagram illustrating a semiconductor memory device 50 according to an embodiment of the present invention.

Referring to FIG. 2, the semiconductor memory device 50 may include a memory cell array 100 and a peripheral circuit 110.

The memory cell array 100 may include a plurality of memory blocks BLK1 to BLKz. The plurality of memory blocks BLK1 to BLKz may be connected to an address decoder 120 through row lines RL, and to a read/write circuit 140 through bit lines BL1 to BLm. Each of the plurality of memory blocks BLK1 to BLKz may include a plurality of memory cells. As an embodiment, the plurality of memory cells may be nonvolatile memory cells.

The peripheral circuit 110 may include the address decoder 120, a voltage generator 130, the read/write circuit 140, a data input/output circuit 150, a control logic 160, and a comparator 170.

The address decoder 120 may be connected to the memory cell array 100 through the row lines RL. The address decoder 120 may operate according to control of the control logic 160.

The address decoder 120 may receive an address ADDR through a global buffer (not shown) located inside the semiconductor memory device 50. The address ADDR may include a block address and a row address when a read operation is performed.

The address decoder 120 may decode the block address of the received address ADDR. The address decoder 120 may select one memory block of the memory blocks BLK1 to BLKz according to the decoded block address.

The address decoder 120 may decode the row address of the received address ADDR. The address decoder 120 may apply voltages provided from the voltage generator 130 to the row lines RL, and select one word line of the selected memory block according to the decoded row address. A read voltage may be applied to the selected word line. A pass voltage, which may be higher than the read voltage, may be applied to unselected word lines.

The address decoder 120 may include an address buffer, a block decoder, a row decoder, and so on.

The voltage generator 130 may generate a plurality of voltages using an external power voltage provided to the semiconductor memory device 50. The voltage generator 130 may operate according to control of the control logic 160.

As an embodiment, the voltage generator 130 may regulate the external power voltage, and generate an internal power voltage. The internal power voltage generated by the voltage generator 130 may be an operation voltage of the semiconductor memory device 50.

As an embodiment, the voltage generator 130 may generate a plurality of voltages using the external power voltage or the internal power voltage. For example, the voltage generator 130 may include a plurality of pumping capacitors configured to receive the internal power voltage, selectively activate the plurality of pumping capacitors, and generate the plurality of voltages according to control of the control logic 160. The generated voltages may be applied to the word lines by the address decoder 120.

The read/write circuit 140 may include first to $m^{th}$ page buffers PB1 to PBm. The first to $m^{th}$ page buffers PB1 to PBm may be connected to the memory cell array 100 through first to $m^{th}$ bit lines BL1 to BLm, respectively. The first to $m^{th}$ page buffers PB1 to PBm may operate according to control of the control logic 160.

The first to $m^{th}$ page buffers PB1 to PBm exchange data DATA with the data input/output circuit 150. When a read operation is performed, the first to $m^{th}$ page buffers PB1 to PBm may read the data DATA from the memory cells connected to the selected word line through the first to $m^{th}$ bit lines BL1 to BLm, and output the read data DATA to the data input/output circuit 150 through data lines DL.

As an embodiment, the read/write circuit 140 may further include a column select circuit.

The data input/output circuit 150 may be connected to the first to $m^{th}$ page buffers PB1 to PBm through the data lines DL. The data input/output circuit 150 may operate according to control of the control logic 160. When a read operation is performed, the data input/output circuit 150 may receive the data DATA from the first to $m^{th}$ page buffers PB1 to PBm, and transmit the received data DATA to the global buffer (not shown) of the semiconductor memory device 50.

The control logic 160 may be connected to the address decoder 120, the voltage generator 130, the read/write circuit 140, the data input/output circuit 150, and the comparator 170. The control logic 160 may receive a command CMD through the global buffer (not shown) of the semiconductor memory device 50. The control logic 160 may control overall operations of the semiconductor memory device 50 in response to the command CMD.

According to an embodiment of the present invention, the control logic 160 may regulate the read voltage generated by the voltage generator 130 in response to a detection signal DS outputted from the comparator 170.

The voltage generator 130 may sequentially generate a plurality of test voltages, each level of which is higher than a previously generated test voltage. Whenever each of the test voltages is applied to the selected word line, the page buffers PB1 to PBm may read page data from selected memory cells. Each time page data is read, the control logic 160 may compare a currently read-out page data and a previously read-out page data, and detect bits changed from a first logical state (for example, a logic "low") to a second logical state (for example, a logic "high") between the currently read-out page data and the previously read-out page data. As a detection result, when the number of bits changed from the first logical state to the second logical state is smallest, the corresponding test voltage may be determined as the read voltage.

More particularly, first to $k^{th}$ (k is a natural number equal to or greater than 3) page data may be read from the selected memory cells using first to $k^{th}$ test voltages. The control logic 160 may detect data bits changed between $(k-2)^{th}$ and $(k-1)^{th}$ page data, and store a result of detection in latches of the page buffers PB1 to PBm. Further, the control logic 160 may detect data bits changed between $(k-1)^{th}$ and $k^{th}$ page data, and store a detection result in other latches of the page buffers PB1 to PBm.

The comparator 170 may compare the number of changed bits between $(k-2)^{th}$ and $(k-1)^{th}$ page data, and the number of changed bits between $(k-1)^{th}$ and $k^{th}$ page data according to control of the control logic 160. According to a result of comparison, the comparator 170 may generate the detection signal DS. The control logic 160 may determine the read voltage in response to the detection signal DS.

According to an embodiment of the present invention, the semiconductor memory device 50 may regulate the read voltage without intervention of an external controller. Therefore, the time required for regulating the read voltage can be shortened.

Figure 3:
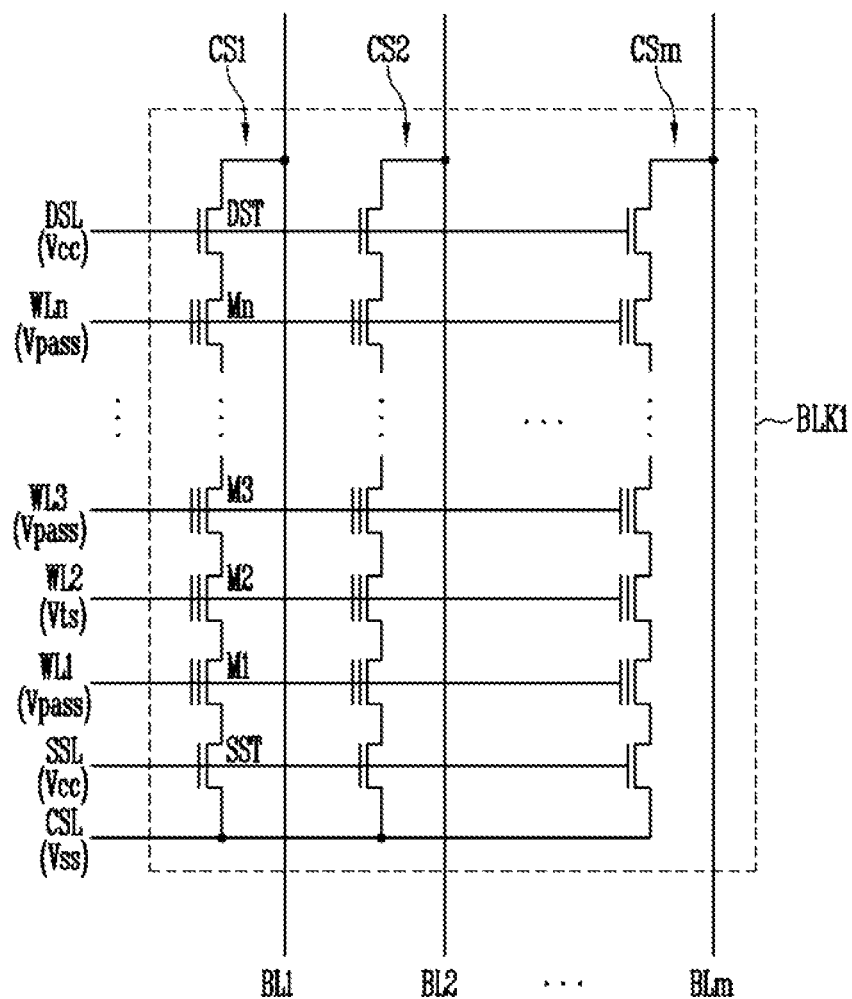
FIG. 3 is a circuit diagram illustrating one of a plurality of memory blocks shown in FIG. 2 specifically.

FIG. 3 is a circuit diagram illustrating a memory block BLK1 of the plurality of memory blocks BLK1 to BLKz shown in FIG. 2.

Referring to FIGS. 2 and 3, the memory block BLK1 may include first to $m^{th}$ cell strings CS1 to CSm. The first to $m^{th}$ cell strings CS1 to CSm may be connected to first to $m^{th}$ bit lines BL1 to BLm, respectively.

Each of the plurality of cell strings CS1 to CSm may include a source select transistor SST, a plurality of memory cells M1 to Mm, and a drain select transistor DST. The source select transistor SST may be connected to a source select line SSL. The first to $m^{th}$ memory cells M1 to Mm may be connected to first to $m^{th}$ word lines WL1 to WLm, respectively. The drain select transistor DST may be connected to a drain select line DSL. A source node of the source select transistor SST may be connected to a common source line CSL. A drain node of the drain select transistor DST may be connected to the bit lines BL1 to BLm. The source select line SSL, the first to $m^{th}$ word lines WL1 to WLm, and the drain select line DSL may be included in the row lines RL described with reference to FIG. 2, and driven by the address decoder 120. The common source line CSL may be controlled by, for example, a common source line controller (not shown).

As an embodiment, although not shown in FIG. 3, the memory block BLK1 may be further connected to one or more dummy word lines, and may further include the memory cells connected to the dummy word lines. As an embodiment, different from FIG. 3, the memory block BLK1 may be connected to two or more additional drain select lines, and may include additional drain select transistors connected to the additional drain select lines. Further, the memory block BLK1 may be connected to two or more additional source select lines, and may include additional source select transistors connected to the additional source select lines.

For regulation of a read voltage, the first to $m^{th}$ bit lines BL1 to BLm may be precharged. The common source line CSL may be kept to a ground voltage. A power voltage may be applied to the source select line SSL and the drain select line DSL, and the source select transistors SST and the drain select transistors DST may be turned on. A pass voltage Vpass of a high level may be applied to the unselected word lines WL1 and WL3 to WLn, and the corresponding memory cells may be turned on regardless of their threshold voltages. A test voltage Vts may be applied to the selected word line WL2, and selected memory cells M2 may be turned on or off according to their threshold voltages. The first to $m^{th}$ page buffers PB1 to PBm may detect voltage changes of the first to $m^{th}$ bit lines BL1 to BLm, and read one piece of page data of the selected memory cells. The page data may include m number of bits respectively corresponding to the m number of the selected memory cells.

A plurality of pieces of page data of the selected memory cells may be read using the sequentially generated plurality of test voltages, each level of which is higher than a previously generated test voltage. This will be described with reference to FIG. 4 in more detail.

Figure 4:
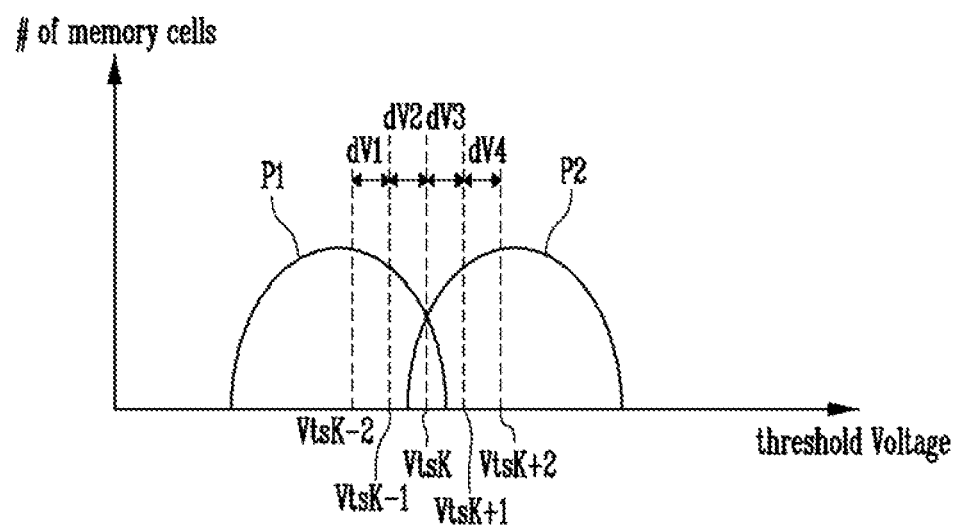
FIG. 4 is a graph illustrating a threshold voltage distribution of selected memory cells.

FIG. 4 is a graph illustrating a threshold voltage distribution of selected memory cells. In FIG. 4, the horizontal-axis represents a threshold voltage, and the vertical-axis represents a number of memory cells.

Referring to FIG. 4, the selected memory cells have a first threshold voltage state P1, and a second threshold voltage state P2. As shown in FIG. 4, the thresh voltages of the first threshold voltage state P1 and the second threshold voltage state P2 may partly overlap.

As a plurality of test voltages VtsK−2 to VtsK+2 are sequentially applied to selected word lines, a plurality of pieces of page data may be read from the selected memory cells. When the $(K-2)^{th}$ test voltage VtsK−2 is applied to the selected word line, page buffers PB1 to PBm read $(K-2)^{th}$ page data. When a threshold voltage of a memory cell is higher than the $(K-2)^{th}$ test voltage VtsK−2, data of the corresponding memory cell may be read as the first logical state (a logic "low"). When the threshold voltage of the memory cell is lower than the $(K-2)^{th}$ test voltage VtsK−2, data of the corresponding memory cell may be read as the second logical state (a logic "high"). That is, the $(K-2)^{th}$ page data may be determined to be in the first or second logical state according to whether the threshold voltages of the selected memory cells are lower or higher than the $(K-2)^{th}$ test voltage VtsK−2.

In the same way, $(K-1)^{th}$ to $(K+2)^{th}$ page data may be read from the selected memory cells using the $(K-1)^{th}$ to $(K+2)^{th}$ test voltages VtsK−1 to VtsK+2, respectively. That is, the $(K-2)^{th}$ to $(K+2)^{th}$ page data may be sequentially determined to be in the first or second logical state using the $(K-2)^{th}$ to $(K+2)^{th}$ test voltages VtsK−2 to VtsK+2.

According to an exemplary embodiment, whenever each of the multiple test voltages VtsK−1 to VtsK+2 is applied, the bit lines BL1 to BLm shown in FIG. 1 may be precharged, and a plurality of pieces of page data may be read.

According to another exemplary embodiment, the bit lines BL1 to BLm may be precharged when a read operation using one of the multiple test voltages VtsK−2 to VtsK+2 is performed on the first page data. Subsequently, read operations using the rest of the multiple test voltages VtsK−2 to VtsK+2 are performed without further precharge of the bit lines BL1 to BLm. In this case, the regulating speed of the read voltage may be improved.

Figure 5:
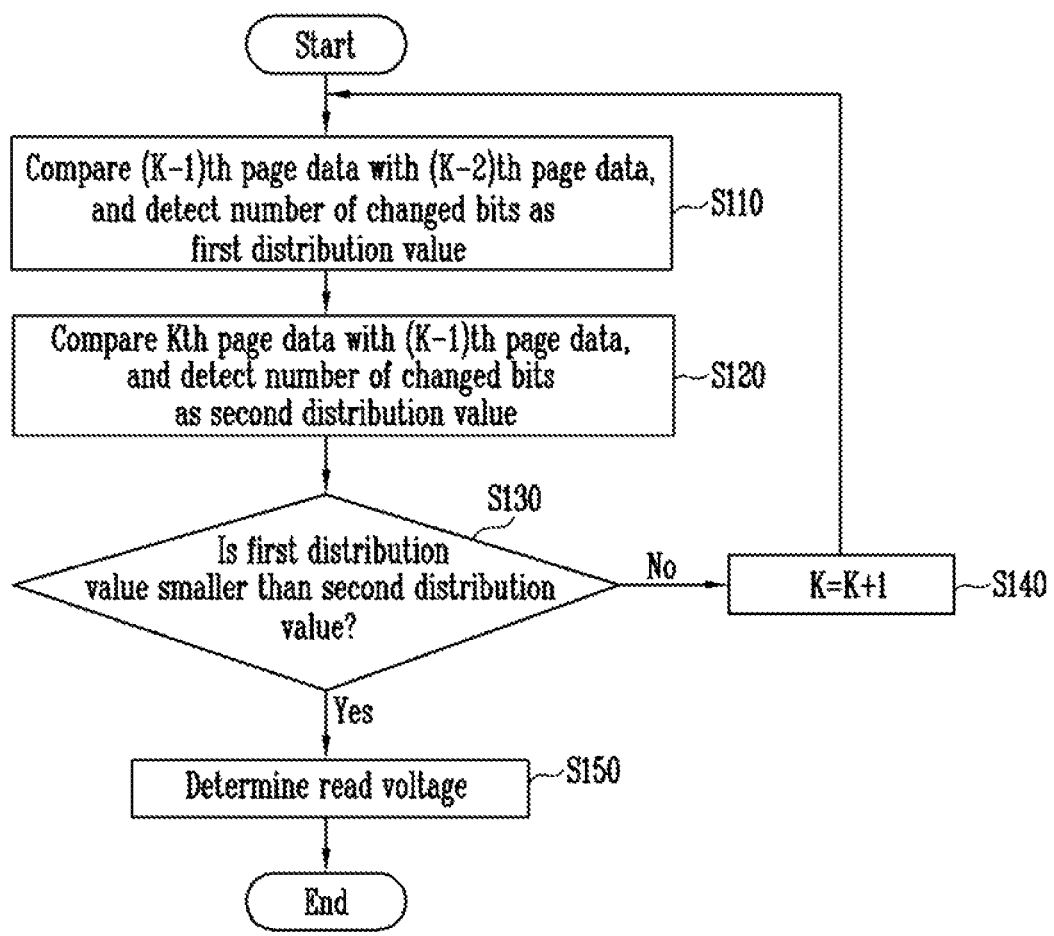
FIG. 5 is a flowchart illustrating a method of operating a semiconductor memory device according to an embodiment of the present invention.

FIG. 5 is a flowchart illustrating a method of operating the semiconductor memory device 50 according to an embodiment of the present invention.

Referring to FIGS. 4 and 5, in operation S110, $(K-1)^{th}$ page data may be compared with $(K-2)^{th}$ page data, and a number of bits, the logic values of which are changed from "low" to "high", may be detected as a first distribution value.

Operation S110 may include an operation of reading the $(K-1)^{th}$ page data and the $(K-2)^{th}$ page data, and an operation of comparing the $(K-1)^{th}$ page data and the $(K-2)^{th}$ page data. The $(K-2)^{th}$ page data may be read using the $(K-2)^{th}$ test voltage VtsK−2. The $(K-1)^{th}$ page data may be read using the $(K-1)^{th}$ test voltage VtsK−1. Here, memory cells in a first voltage range dV1, which is the difference between the $(K-2)^{th}$ test voltage VtsK−2 and the $(K-1)^{th}$ test voltage VtsK−1, may be determined to have a logical value "low" during a read operation using the $(K-2)^{th}$ test voltage VtsK−2, and to have a logical value "high" during a read operation using the $(K-1)^{th}$ test voltage VtsK−1. Therefore, the number of memory cells corresponding to the first voltage range dV1 may be the number of bits, the logic values of which are changed from "low" to "high." That is, the first distribution value means the number of memory cells corresponding to the first voltage range dV1.

In operation S120, $K^{th}$ page data may be compared with the $(K-1)^{th}$ page data, and the number of bits, the logic values of which are changed from "low" to "high", may be detected as a second distribution value.

Operation S120 may include an operation of reading the Km and the $(K-1)^{th}$ page data, and an operation of comparing the $K^{th}$ page data and the $(K-1)^{th}$ page data.

The $K^{th}$ page data may be read using the $K^{th}$ test voltage VtsK. Memory cells corresponding to a second voltage range dV2, which is the difference between the $(K-1)^{th}$ test voltage VtsK−1 and the $K^{th}$ test voltage VtsK, may be determined to have a logical value "low" during a read operation using the $(K-1)^{th}$ test voltage VtsK−1, and to have a logical value "high" during a read operation using the $K^{th}$ test voltage VtsK. Therefore, the second distribution value means the number of memory cells corresponding to the second voltage range dV2.

In operation S130, it may be determined whether the first distribution value is smaller than the second distribution value. If the first distribution value is not smaller than the second distribution value, operation S140 may be performed. Otherwise, operation S150 may be performed.

For example, as shown in FIG. 4, the number of memory cells corresponding to the first voltage range dV1 may be greater than the number of memory cells corresponding to the second voltage range dV2. That is, because the first distribution value is greater than the second distribution value, operation S140 may be performed.

In operation S140, a K value increases by 1.

In operation S150, if the first distribution value is smaller than the second distribution value, a read voltage may be determined. Here, the read voltage may be determined as a previous test voltage VtsK−1 of the current test voltage VtsK.

Meanwhile, because operations S110 and S120 may be performed again after operation S140, the first distribution value may be defined as the number of memory cells corresponding to the second voltage range dV2, and the second distribution value may be defined as the number of memory cells corresponding to a third voltage range dV3. In operation S130, as a comparison result of the first distribution value and the second distribution value, when the first distribution value is found to be smaller than the second distribution value, the read voltage may be determined as the $K^{th}$ test voltage VtsK.

According to the embodiment of the present invention, bits, the logic values of which are changed from "low" to "high", may be checked whenever the page data is read while increasing the test voltage, and the read voltage may be determined when the number of changed bits is smallest. That is, the semiconductor memory device 50 itself may regulate the read voltage without intervention of an external controller.

Figure 6:
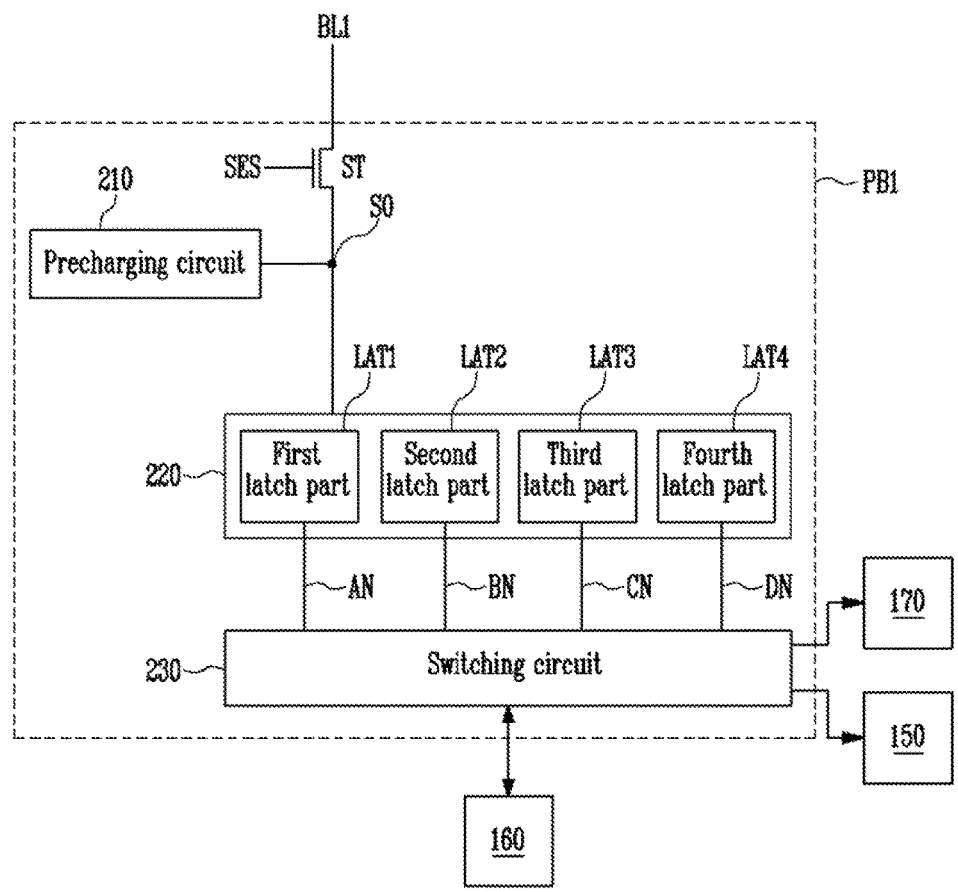
FIG. 6 is a block diagram illustrating one of the page buffers shown in FIG. 2.

FIG. 6 is a block diagram illustrating one PB1 of page buffers PB1 to PBm shown in FIG. 2.

Referring to FIG. 6, a first page buffer PB1 may include a sensing transistor ST, a precharging circuit 210, a latch circuit 220, and a switching circuit 230.

The sensing transistor ST may be connected between a first bit line BL1 and a sense node SO. The sensing transistor ST may be turned on in response to a sensing signal SES received from a control logic 160.

The precharging circuit 210 may be connected to the sense node SO, and to the first bit line BL1 through the sensing transistor ST. The precharging circuit 210 may precharge the first bit line BL1 through the sensing transistor ST according to control of the control logic 160.

The latch circuit 220 may be connected to the sense node SO. The latch circuit 220 may include first to fourth latch parts LAT1 to LAT4. Each of the first to fourth latch parts LAT1 to LAT4 may store one bit. Data read from the memory cell through the first bit line BL1 may be stored in the first latch part LAT1. The first to fourth latch parts LAT1 to LAT4 may exchange data according to control of the control logic 160.

The first to fourth latch parts LAT1 to LAT4 may be connected to the switching circuit 230 through first to fourth nodes AN to DN, respectively. The first to fourth latch parts LAT1 to LAT4 may be connected to a data input/output circuit 150 and a comparator 170 through the switching circuit 230.

Figure 7:
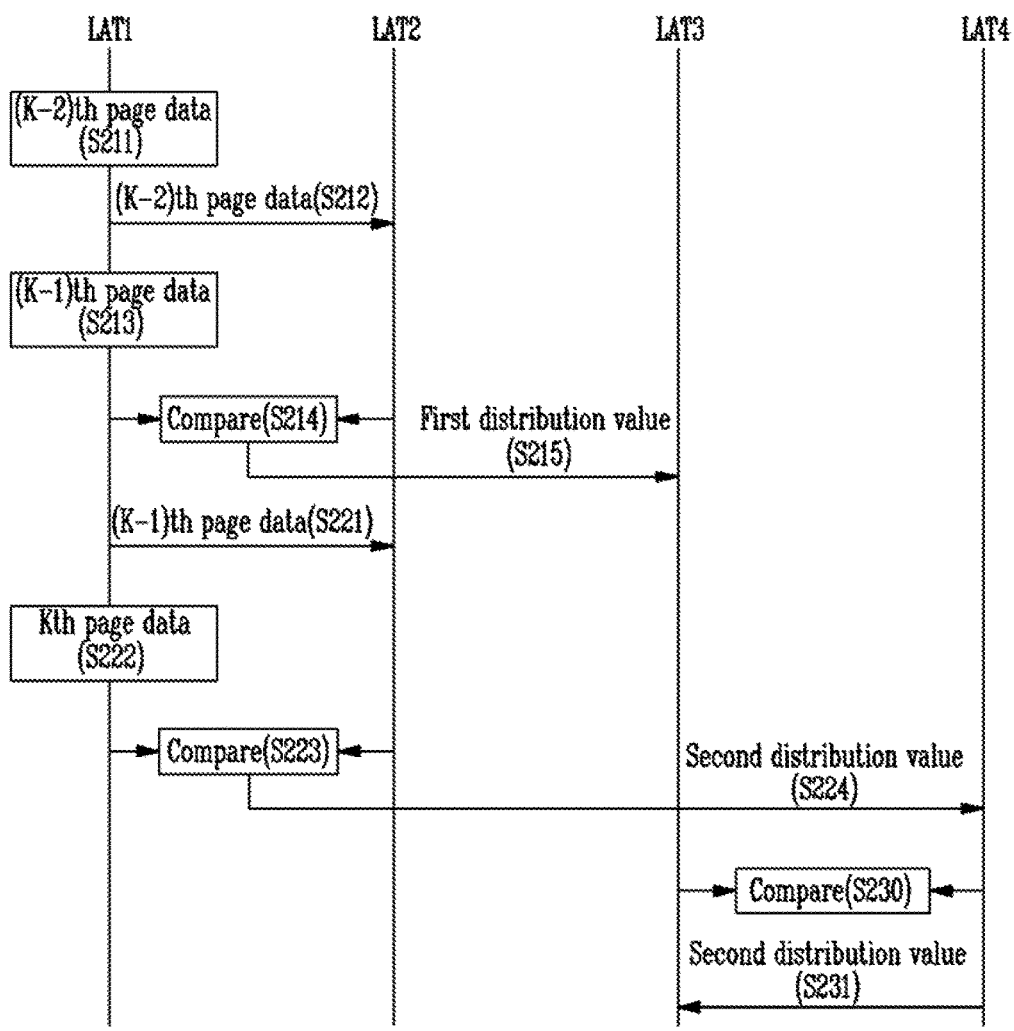
FIG. 7 is a detailed transaction flowchart illustrating steps S110 to S130 shown in FIG. 5.

FIG. 7 is a detailed transaction flowchart illustrating steps S110 to S130 shown in FIG. 5.

Referring to FIG. 7, operations S211 to S215 may correspond to operation S110 described above with reference to FIG. 5, operations S221 to S224 may correspond to operation S120 described above with reference to FIG. 5, and operations S230 to S231 may correspond to operation S130 described above with reference to FIG. 5. In operation S211, first latch parts LAT1 of page buffers PB1 to PBm may store the $(K-2)^{th}$ page data read from selected memory cells using the $(K-2)^{th}$ test voltage VtsK−2. In operation S212, the $(K-2)^{th}$ page data may be transmitted to second latch parts LAT2 of the page buffers PB1 to PBm.

In operation S213, $(K-1)^{th}$ page data may be read from the selected memory cells using the $(K-1)^{th}$ test voltage VtsK−1, and stored in the first latch parts LAT1.

In operation S214, the $(K-1)^{th}$ page data stored in the first latch parts LAT1, and the $(K-2)^{th}$ page data stored in the second latch parts LAT2 may be compared. In operation S215, a result of the comparison may be stored in third latch parts LAT3 of the page buffers PB1 to PBm. The control logic 160 may compare the $(K-1)^{th}$ page data and the $(K-2)^{th}$ page data, detect bits, the logic values of which are changed from "low" to "high", and store the detected bits in the third latch parts LAT3. As an embodiment, the control logic 160 stores a logical value "high" in the third latch parts LAT3 according to the detected bits. A number of the third latch parts LAT3 of the page buffers PB1 to PBm storing the detected bits or the logical value "high" may correspond to the first distribution value.

In operation S221, the $(K-1)^{th}$ page data may be transmitted to and stored in the second latch parts LAT2.

In operation S222, the $K^{th}$ page data may be read from the selected memory cells using the $K^{th}$ test voltage VtsK, and stored in the first latch parts LAT1.

In operation S223, the $K^{th}$ page data stored in the first latch parts LAT1 and the $(K-1)^{th}$ page data stored in the second latch parts LAT2 may be compared. In operation S224, a result of the comparison may be stored in fourth latch parts LAT4 of the page buffers PB1 to PBm. The control logic 160 may compare the $K^{th}$ page data and the $(K-1)^{th}$ page data, and detect bits, the logic values of which are changed from "low" to "high." As an embodiment, the control logic 160 may store a logical value "high" in the fourth latch parts LAT4 according to the detected bits. Data stored in the fourth latch parts LAT4 of the page buffers PB1 to PBm storing the detected bits or the logical value "high" may correspond to the second distribution value.

In operation S230, the data stored in the third latch parts LAT3 and the data stored in the fourth latch parts LAT4 may be compared. As an example, the comparator 170 may determine which of the third latch parts LAT3 and the fourth latch parts LAT4 of the page buffers PB1 to PBm store more detected bits. That is, the comparator 170 may compare the first distribution value and the second distribution value. This will be described with reference to FIG. 8 in more detail.

In operation S231, the distribution value stored in the fourth latch parts LAT4 may be stored in the third latch parts LAT3.

Thereafter, operations S221 to S224, and operations S230 and S231 may be repeated according to a determination result of the comparator 170.

Figure 8:
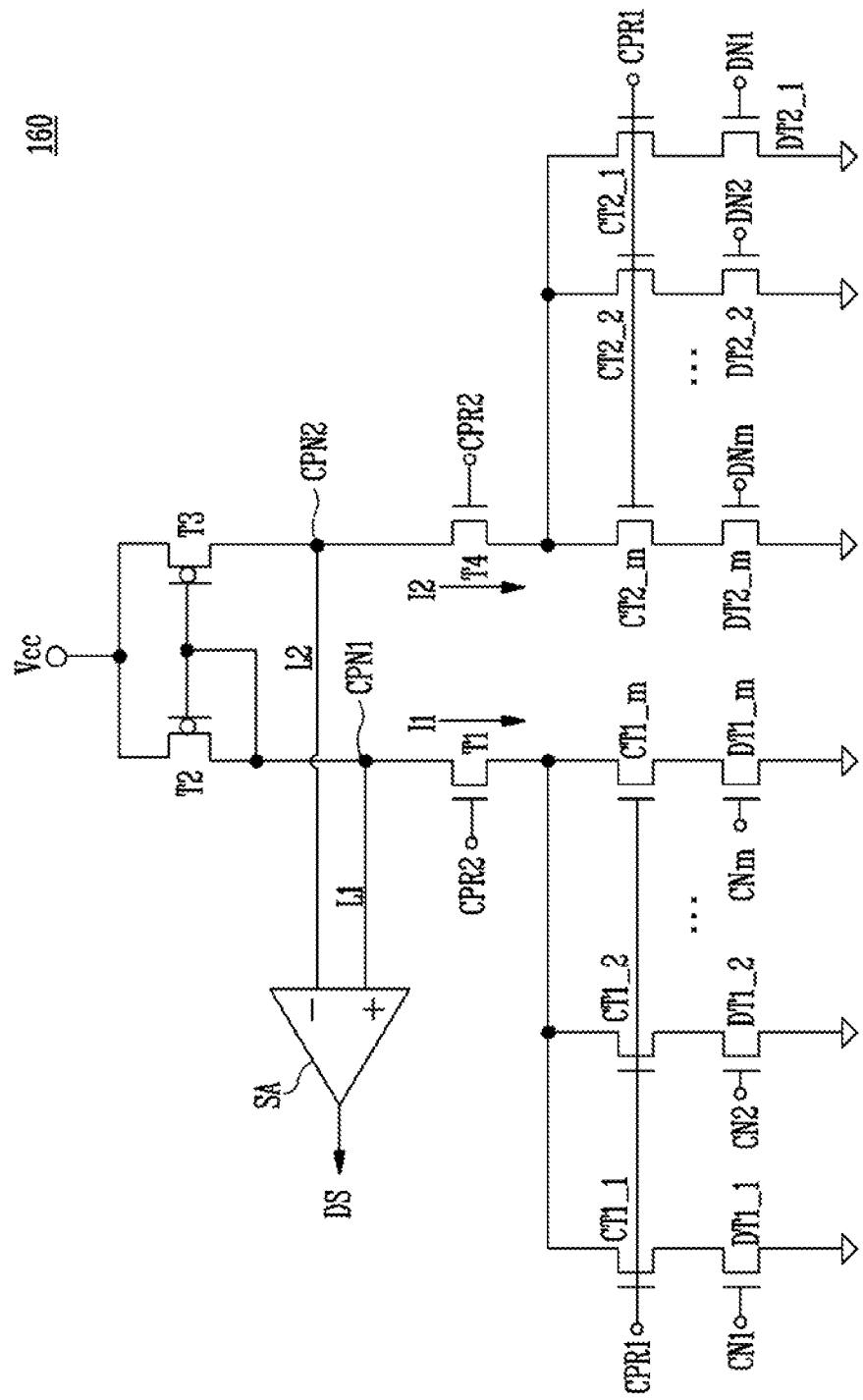
FIG. 8 is a circuit diagram illustrating a comparator shown in FIG. 2.

FIG. 8 is a circuit diagram illustrating the comparator 170 shown in FIG. 2.

Referring to FIG. 8, the comparator 170 may include first detection transistors DT1_1 to DT1_m, first control transistors CT1_1 to CT1_m, first to fourth transistors T1 to T4, second detection transistors DT2_1 to DT2_m, second control transistors CT2_1 to CT2_m, and a comparing part SA.

The first detection transistors DT1_1 to DT1_m may be connected in parallel between a reference node and the first control transistors CT1_1 to CT1_m. Each gate of the first detection transistors DT1_1 to DT1_m may be connected to the third latch parts LAT3 through the third nodes CN1 to CNm in page buffers PB1 to PBm, respectively. That is, the first detection transistors DT1_1 to DT1_m may be turned on in response to the first distribution value stored in the third latch parts LAT3.

The second detection transistors DT2_1 to DT2_m may be connected in parallel between the second control transistors CT2_1 to CT2_m and the reference node. Each gate of the second detection transistors DT2_1 to DT2_m may be connected to the fourth latch parts LAT4 through the fourth nodes DN1 to DNm in the page buffers PB1 to PBm, respectively. That is, the second detection transistors DT2_1 to DT2_m may be turned on in response to the second distribution value stored in the fourth latch parts LAT4.

The first control transistors CT1_1 to CT1_m may be connected between the first detection transistors DT1_1 to DT1_m and the first transistor T1. The first control transistors CT1_1 to CT1_m may operate in response to a first comparison signal CPR1. The first comparison signal CPR1 may be provided from the control logic 160.

The second control transistors CT2_1 to CT2_m may be connected between the fourth transistor T4 and the second detection transistors DT2_1 to DT2_m, and operate in response to the first comparison signal CPR1.

The first transistor T1 may be connected between the first control transistors CT1_1 to CT1_m and a first comparison node CPN1, and may operate in response to a second comparison signal CPR2. The second comparison signal CPR2 may be provided from the control logic 160.

The fourth transistor T4 may be connected between a second comparison node CPN2 and the second control transistors CT2_1 to CT2_m, and may operate in response to the second comparison signal CPR2.

The second and third transistors T2 and T3 may form a current mirror. The second transistor T2 may be connected between a power voltage Vcc and the first comparison node CPN1. A drain and a gate of the second transistor T2 may be connected with each other. The third transistor T3 may be connected between the power voltage Vcc and the second comparison node CPN2. Gates of the second and third transistors T2 and T3 may be connected with each other.

The first detection transistors DT1_1 to DT1_m may be turned on when the third latch parts LAT3 store a logical value "high." The number of turned-on first detection transistors DT1_1 to DT1_m may be the first distribution value.

When the first and second comparison signals CPR1 and CPR2 are enabled, a first current I1 flows through the first transistor T1 according to the number of turned-on first detection transistors DT1_1 to DT1_m. The first current I1 may mirror a second current I2 flowing through the fourth transistor T4.

The second detection transistors DT2_1 to DT2_m may be turned on when the fourth latch parts LAT4 store a logical value "high." The number of turned-on second detection transistors DT2_1 to DT2_m may be the second distribution value.

A voltage of the first comparison node CPN1 and a voltage of the second comparison node CPN2 may be determined according to the first distribution value and the second distribution value, respectively. When the first distribution value is greater than the second distribution value, resistances of the first detection transistors DT1_1 to DT1_m may be small, and thus a voltage of the first comparison node CPN1 may be lower than the second comparison node CPN2. When the first distribution value is smaller than the second distribution value, resistances of the first detection transistors DT1_1 to DT1_m may be increased, and thus the voltage of the first comparison node CPN1 may be higher than the second comparison node CPN2.

Therefore, when the first distribution value is greater than the second distribution value, the voltage of the first comparison node CPN1 may be lower than that of the second comparison node CPN2. Thus, the comparing part SA may disable the detection signal DS. When the first distribution value is smaller than the second distribution value, the voltage of the first comparison node CPN1 may be higher than that of the second comparison node CPN2. Thus, the comparing part SA may enable the detection signal DS.

The control logic 160 may determine a corresponding one of the multiple test voltages VtsK−1 to VtsK+2 as the read voltage when the detection signal DS is enabled or when the first distribution value is smaller than the second distribution value, and control the voltage generator 130 to generate the determined read voltage.

Figure 9:
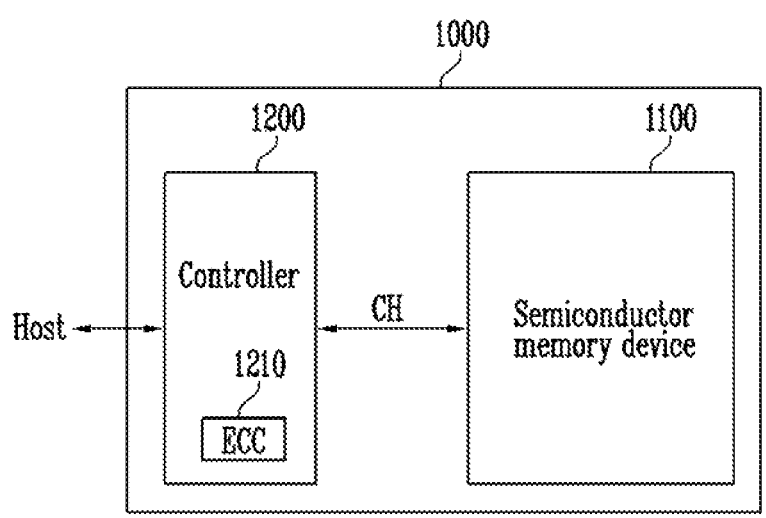
FIG. 9 is a block diagram illustrating a memory system including a semiconductor memory device.

FIG. 9 is a block diagram illustrating a memory system 1000 including a semiconductor memory device 1100.

Referring to FIG. 9, the memory system 1000 may include the semiconductor memory device 1100 and a controller 1200.

The semiconductor memory device 1100 may be the semiconductor memory device 50 described with reference to FIGS. 2 to 8. Repeated descriptions will be omitted below.

The controller 1200 may be connected between a host Host and the semiconductor memory device 1100. The controller 1200 may control the semiconductor memory device 1100. The controller 1200 may access the semiconductor memory device 1100 in response to a request from the host Host. For example, the controller 1200 may control read, write, erase, and background operations of the semiconductor memory device 1100. The controller 1200 may provide an interface between the semiconductor memory device 1100 and the host Host. The controller 1200 may drive firmware in order to control the semiconductor memory device 1100.

The controller 1200 may include an error correcting code (ECC) circuit 1210. The ECC circuit 1210 may generate a parity bit using data to be stored in the semiconductor memory device 1100. The generated parity bit may be stored in a spare area of the semiconductor memory device 1100. The ECC circuit 1210 may detect and correct an error of data read from the semiconductor memory device 1100 using the parity bit. However, when more error bits than a predetermined number are included in the read data, the corresponding error bits cannot be corrected. Here, the controller 1200 may control the semiconductor memory device 1100 to reset a read voltage.

Figure 10:
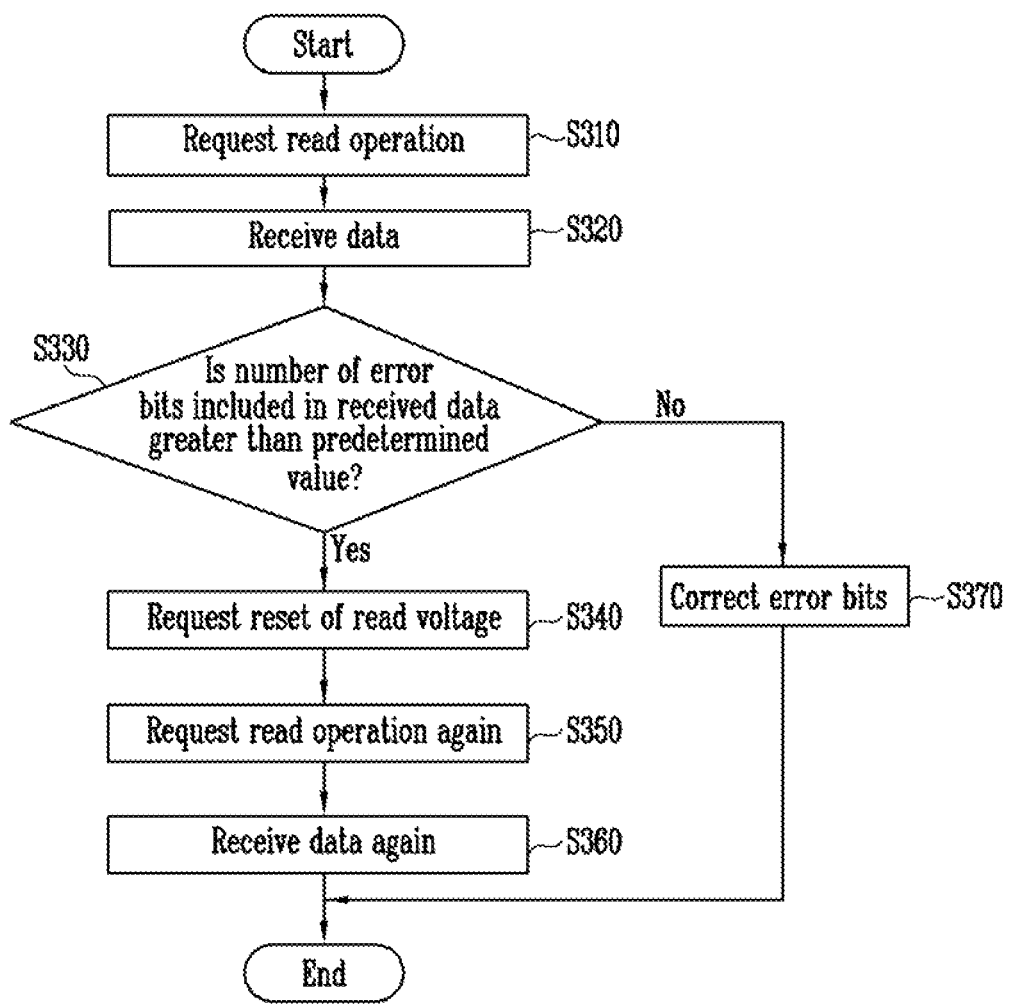
FIG. 10 is a flowchart illustrating a method of operating a controller shown in FIG. 9.

FIG. 10 is a flowchart illustrating a method of operating a controller 1200 shown in FIG. 9.

Referring to FIG. 10, in operation S310, the controller 1200 may request a read operation to the semiconductor memory device 1100. The controller 1200 may transmit a command CMD and an address ADDR corresponding to the read operation to the semiconductor memory device 1100.

In operation S320, the controller 1200 may receive data through the read operation.

In operation S330, the ECC circuit 1210 may determine whether the number of error bits included in the received data is greater than a predetermined value. Here, the predetermined value means the number of error bits correctable by the ECC circuit 1210.

In operation S340, the controller 1200 may transmit a command CMD that requests to reset a read voltage to the semiconductor memory device 1100. The semiconductor memory device 1100 may reset the read voltage in response to the command CMD as described with reference to FIGS. 2 to 8.

In operation S350, when resetting of the read voltage is finished, the controller 1200 may request the read operation to the semiconductor memory device 1100 again. In operation S360, the controller 1200 may receive the data again.

In operation S370, when the number of error bits included in the received data is smaller than the predetermined value, the ECC circuit 1210 may correct the error bits.

Figure 11:
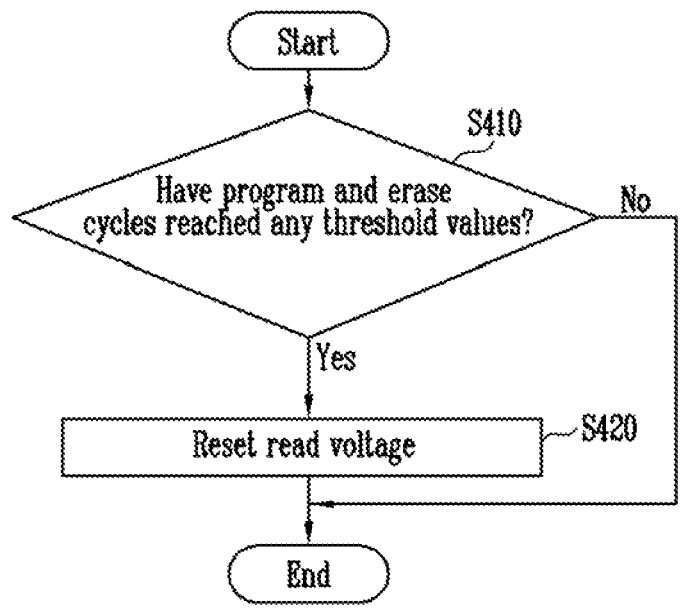
FIG. 11 is a flowchart illustrating a method of operating a semiconductor memory device shown in FIG. 9 according to an embodiment of the present invention.

FIG. 11 is a flowchart illustrating a method of operating a semiconductor memory device 1100 shown in FIG. 9 according to an embodiment of the present invention.

Referring to FIG. 11, in operation S410, it may be determined whether program and erase cycles of the semiconductor memory device 1100 have reached any threshold values. As an embodiment, the control logic 160 may manage the program and erase cycles, and store information of the program and erase cycles in one of the memory blocks BLK1 to BLKz.

In operation S420, when the program and erase cycles have reached one of the threshold values, a read voltage may be reset as described with reference to FIGS. 2 to 8.

In addition to the embodiments described above with reference to FIGS. 10 and 11, the read voltage of the semiconductor memory device 1100 may be regulated under various conditions. For example, the semiconductor memory device 1100 may periodically reset the read voltage.

Figure 12:
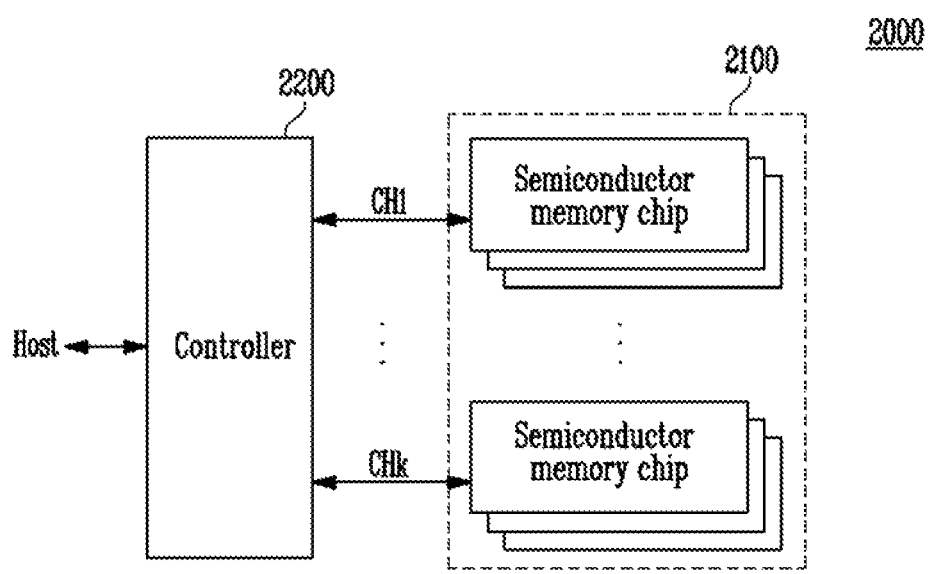
FIG. 12 is a block diagram illustrating a memory system according to another embodiment.

FIG. 12 is a block diagram illustrating a memory system 2000 according to another embodiment.

Referring to FIG. 12, the memory system 2000 may include a semiconductor memory device 2100 and a controller 2200. The semiconductor memory device 2100 may include a plurality of semiconductor memory chips. The plurality of semiconductor memory chips may be divided into a plurality of groups. Each group may communicate with the controller 2200 through one common channel. In FIG. 12, the plurality of groups are shown to communicate with the controller 2200 through each of first to k$^{th}$ channels CH1 to CHk. Each semiconductor memory chip may be the same as the semiconductor memory device 50 described with reference to FIGS. 2 to 8.

In FIG. 12, it is described that the plurality of semiconductor memory chips are connected to one channel. However, it will be understood that the memory system 2000 can be changed so that one semiconductor memory chip is connected to one channel.

The semiconductor memory device 2100 and the controller 2200 may be integrated into one semiconductor device. As an embodiment, the semiconductor memory device 2100 and the controller 2200 may be integrated into one semiconductor device and configure a memory card. For example, the semiconductor memory device 2100 and the controller 2200 may be integrated into one semiconductor device and may configure a memory card such as a personal computer (PC) card (Personal Computer Memory Card International Association (PCMCIA)), a Compact Flash (CF) card, a SmartMedia (SM) card (SMC), a Memory Stick, an MMC (reduced Size MMC (RS-MMC), MMCmicro), a Secure Digital (SD) card (miniSD, microSD, SD High Capacity (SDHC)), a Universal Flash Storage (UFS), and so on.

The semiconductor memory device 2100 and the controller 2200 may be integrated into one semiconductor device and may configure a solid state drive (SSD). The SSD may include a storage device configured to store data in a semiconductor memory. When the memory system 2000 is used as a SSD, the operation speed of the host Host connected to the memory system 2000 may be innovatively enhanced.

As another example, the memory system 2000 may be provided as at least one of various components of an electronic device such as a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices configuring a home network, at least one of various electronic devices configuring a computer network, at least one of various electronic devices configuring a telematics network, an RFID device, at least one of various components configuring a computing system, etc.

As an embodiment, the semiconductor memory device 2100 or the memory system 2000 may be mounted using various forms of packages. For example, the semiconductor memory device 2100 or the memory system 2000 may be packaged as a package on package (PoP), ball grid arrays (BGAs), chip scale packages (CSPs), a plastic leaded chip carrier (PLCC), a plastic dual inline package (PDIP), a die in waffle pack, a die in wafer form, a chip on board (COB), a ceramic dual inline package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP), a wafer-level processed stack package (WSP), and so on, and may be mounted.

Figure 13:
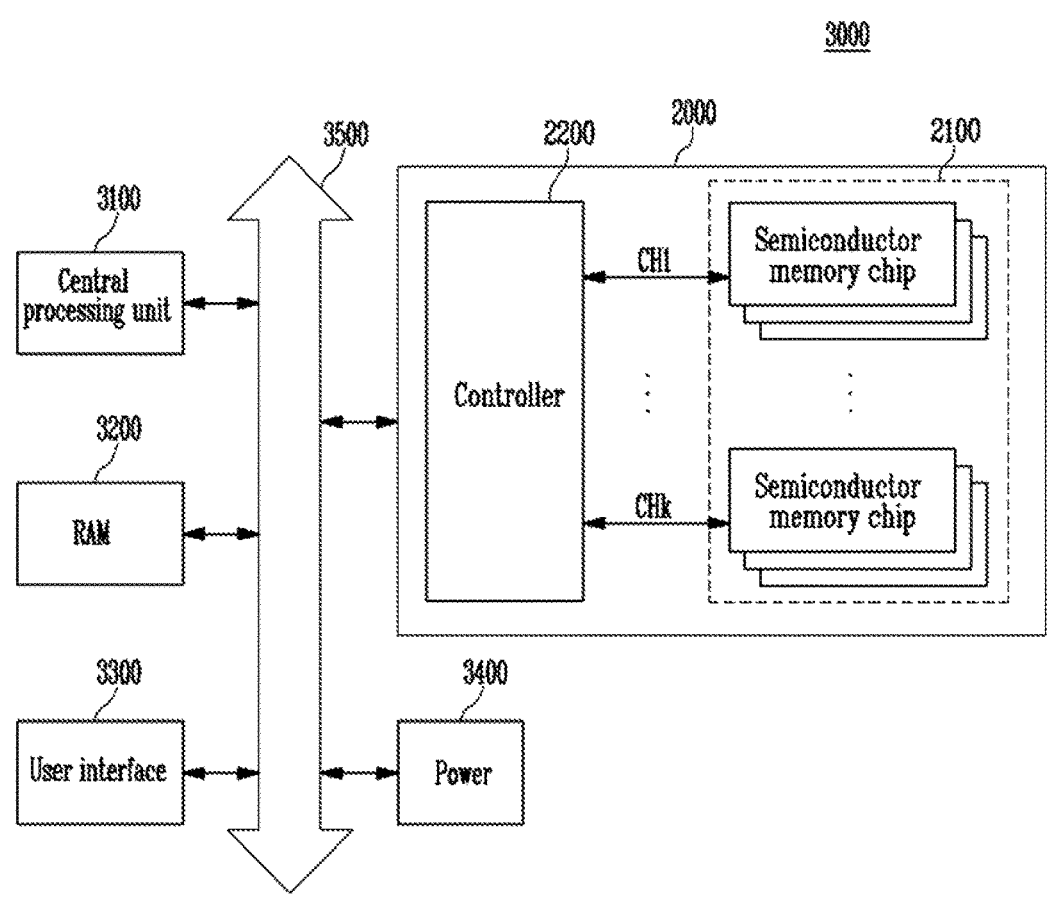
FIG. 13 is a block diagram illustrating a computing system including a memory system described with reference to FIG. 12.

FIG. 13 is a block diagram illustrating a computing system 3000 including a memory system 2000 described with reference to FIG. 12.

Referring to FIG. 13, the computing system 3000 may include a central processing unit 3100, a random access memory (RAM) 3200, a user interface 3300, a power 3400, a system bus 3500, and the memory system 2000.

The memory system 2000 may be electrically connected to the central processing unit 3100, the RAM 3200, the user interface 3300, and the power 3400 through the system bus 3500. Data, which may be provided through the user interface 3300 or processed by the central processing unit 3100, may be stored in the memory system 2000.

In FIG. 13, a semiconductor memory device 2100 is shown connected to the system bus 3500 through the controller 2200. However, the semiconductor memory device 2100 may be directly connected to the system bus 3500.

Here, the function of the controller 2200 may be performed by the central processing unit 3100 and the RAM 3200.

According to the present invention, the read operation and regulating speed of a read voltage of a semiconductor memory device may be improved.

In the drawings and specification, exemplary embodiments of the invention have been disclosed, and although specific terms are employed, they are intended to be used in a generic and descriptive sense only and not for purposes of limitation. As for the scope of the invention, it is to be set forth in the following claims. Therefore, it will be understood by those of ordinary skill in the art that various changes in form and details may be made without departing from the spirit and scope of the present invention as defined by the following claims.

What is claimed is:

1. A semiconductor memory device, comprising:
   memory cells connected to a word line;
   page buffers connected to the memory cells, wherein each of the page buffers includes a first latch and a second latch;
   a comparator generating a detection signal by comparing a first group of data bits stored in the first latches with a second group of data bits stored in the second latches; and
   a control logic controlling the page buffers and the comparator, storing the first group of data bits in the first latches and storing the second group of data bits in the second latches of the page buffers, and determining one of first to $k^{th}$ (k is a natural number equal to or greater than 3) test voltages as a read voltage for a read operation by reading first to $k^{th}$ page data from the memory cells through application of the first to $k^{th}$ test voltages to the word line, and by comparing the number of the first group of data bits changed between the $(k-2)^{th}$ and $(k-1)^{th}$ page data, with the number of the second group of data bits changed between the $(k-1)^{th}$ and $k^{th}$ page data.

2. The device of claim 1, wherein voltage levels of the first to $k^{th}$ test voltages are gradually increased from the first to $k^{th}$ test voltages in order.

3. The device of claim 1, wherein the control logic determines the $(k-1)^{th}$ test voltage as the read voltage when the number of the first group of data bits is smaller than the number of the second group of data bits.

4. The device of claim 1, wherein the control logic determines the read voltage as the $(k-1)^{th}$ test voltage according to the detection signal.

5. The device of claim 1, wherein the control logic manages program and erase cycles, reads the first to $k^{th}$ page data, and determines one of the first to $k^{th}$ test voltages as the read voltage when the program and erase cycles reach one of predetermined values.

* * * * *